(12) United States Patent
Zhang et al.

(10) Patent No.: US 8,736,998 B2
(45) Date of Patent: May 27, 2014

(54) SYSTEMS AND METHODS FOR SYMBOL RE-GROUPING DECODING PROCESSING

(75) Inventors: Fan Zhang, Milpitas, CA (US);
Madhusudan Kalluri, Sunnyvale, CA (US); Shaohua Yang, San Jose, CA (US); Wu Chang, Santa Clara, CA (US); Ming Jin, Fremont, CA (US)

(73) Assignee: LSI Corporation, San Jose, CA (US)

( * ) Notice: Subject to any disclaimer, the term of this patent is extended or adjusted under 35 U.S.C. 154(b) by 70 days.

(21) Appl. No.: 13/474,668

(22) Filed: May 17, 2012

(65) Prior Publication Data

US 2013/0308221 A1 Nov. 21, 2013

(51) Int. Cl.
*G11B 5/09* (2006.01)
*G11B 5/035* (2006.01)

(52) U.S. Cl.
USPC .............................................. 360/39; 360/65

(58) Field of Classification Search
None
See application file for complete search history.

(56) References Cited

U.S. PATENT DOCUMENTS

| 5,701,314 | A  | 12/1997 | Armstrong |
| 5,712,861 | A  | 1/1998  | Inoue     |
| 6,438,717 | B1 | 8/2002  | Butler    |
| 6,657,803 | B1 | 12/2003 | Ling      |
| 7,136,244 | B1 | 11/2006 | Rothberg  |
| 7,702,989 | B2 | 4/2010  | Graef     |
| 7,730,384 | B2 | 6/2010  | Graef     |
| 7,738,201 | B2 | 6/2010  | Jin       |
| 7,971,125 | B2 | 6/2011  | Graef     |
| 7,990,642 | B2 | 8/2011  | Lee       |
| 8,176,404 | B2 | 5/2012  | Yang      |
| 2011/0080211 | A1 | 4/2011 | Yang |
| 2011/0161633 | A1 | 6/2011 | Xu |
| 2011/0264980 | A1* | 10/2011 | Li et al. .................. 714/752 |
| 2012/0200954 | A1 | 8/2012 | Jin |
| 2012/0236429 | A1 | 9/2012 | Yang |

FOREIGN PATENT DOCUMENTS

| EP | 2242054 A2 | 10/2010 |
| WO | WO 2008/087042 A1 | 7/2008 |
| WO | WO 2011/091845 A1 | 8/2011 |

OTHER PUBLICATIONS

Chase, D. "A Class of Algorithms for decoding Block codes with Channel Measurement Information" IEEE Trans. on Inform. Theory,vol. 18 No. 1, Jan. 1, 1972.
Dong-U Lee et al "Pilotless Frame Synchronization via LDPC Code Constraint Feedback" IEEE Comm. Letters, NJ, US vol. 11 No. 8, Aug. 1, 2007.
Olmos et al., "Tree-Structure Expectation Propagation for LDPC Decoding in Erasure Channels", Cornell University Library arXiv:1009.4287 (Sep. 22, 2010).
U.S. Appl. No. 13/459,282, Unpublished (filed Apr. 30, 2012) (Fan Zhang).
U.S. Appl. No. 13/445,858, Unpublished (filed Apr. 12, 2012) (Johnson Yen).
U.S. Appl. No. 13/412,492, Unpublished (filed Mar. 5, 2012) (Shaohua Yang).
U.S. Appl. No. 13/326,367, Unpublished (filed Dec. 15, 2011) (Shaohua Yang).
U.S. Appl. No. 13/372,600, Unpublished (filed Feb. 14, 2012) (Shaohua Yang).
U.S. Appl. No. 13/326,363, Unpublished (filed Dec. 15, 2011) (Fan Zhang).
U.S. Appl. No. 13/465,214, Unpublished (filed May 7, 2012) (Chung-Li Wang).

\* cited by examiner

*Primary Examiner* — Regina N Holder
(74) *Attorney, Agent, or Firm* — Hamilton DeSanctis & Cha

(57) ABSTRACT

The present invention is related to systems and methods for applying a data decode algorithm to different rotations or modifications of a decoder input as part of data processing.

20 Claims, 7 Drawing Sheets

| R/C | A | B | C | D | E | F | G | H | I | J | K | L | M | N | O | P | Q | R |
|---|---|---|---|---|---|---|---|---|---|---|---|---|---|---|---|---|---|---|
| 0 | 0 | 1 | 0 | 0 | 0 | 0 | 0 | 1 | 1 | 0 | 0 | 0 | 1 | 0 | 1 | 1 | 1 | 1 |
| 1 | 0 | 0 | 1 | 1 | 0 | 0 | 1 | 1 | 1 | 1 | 1 | 0 | 0 | 0 | 1 | 1 | 0 |
| 2 | 0 | 0 | 0 | 0 | 1 | 0 | 1 | 0 | 1 | 0 | 0 | 1 | 1 | 0 | 0 | 1 | 1 |
| 3 | 0 | 1 | 1 | 1 | 1 | 1 | 1 | 0 | 0 | 0 | 1 | 0 | 0 | 1 | 1 | 0 | 0 | 1 |
| 4 | 0 | 0 | 1 | 0 | 1 | 1 | 0 | 1 | 0 | 1 | 0 | 1 | 1 | 1 | 1 | 0 | 0 |
| 5 | 1 | 1 | 1 | 0 | 1 | 1 | 1 | 1 | 1 | 1 | 1 | 0 | 0 | 0 | 0 | 0 | 1 |
| 6 | 0 | 1 | 0 | 0 | 0 | 1 | 1 | 0 | 1 | 1 | 1 | 1 | 1 | 0 | 1 | 0 | 1 |
| 7 | 0 | 1 | 0 | 0 | 0 | 0 | 0 | 1 | 1 | 1 | 0 | 0 | 1 | 0 | 1 | 1 | 1 |
| 8 | 0 | 1 | 0 | 1 | 1 | 1 | 1 | 1 | 1 | 1 | 1 | 1 | 0 | 1 | 1 | 0 |
| 9 | 1 | 0 | 0 | 0 | 1 | 1 | 0 | 1 | 0 | 0 | 1 | 1 | 0 | 1 | 0 | 0 | 0 |

|  | Sym A | Sym B | Sym C | Sym D | Sym E | Sym F | Sym G | Sym H | Sym I |
|---|---|---|---|---|---|---|---|---|---|
| Sym 1 | 0 1 | 0 0 | 0 1 | 0 1 | 0 0 | 0 0 | 1 1 | 1 1 | 0 1 | 0 1 | 1 0 | 0 0 | 1 0 | 0 1 | 1 1 | 1 1 | 1 0 |
| Sym 2 | 0 0 | 0 1 | 0 1 | 0 1 | 1 1 | 0 1 | 1 0 | 0 0 | 1 0 | 0 1 | 0 0 | 1 1 | 1 0 | 0 1 | 0 0 | 1 1 |
| Sym 3 | 0 1 | 0 1 | 1 1 | 0 0 | 1 1 | 1 1 | 0 1 | 1 1 | 0 1 | 1 1 | 1 1 | 1 0 | 1 0 | 0 0 | 0 0 | 0 1 |
| Sym 4 | 0 0 | 1 1 | 0 0 | 0 0 | 1 0 | 1 0 | 0 0 | 1 1 | 1 1 | 1 1 | 1 0 | 1 1 | 0 0 | 1 0 | 0 1 | 1 1 |
| Sym 5 | 0 1 | 1 0 | 0 0 | 1 0 | 1 1 | 1 1 | 1 0 | 1 1 | 1 0 | 1 1 | 1 1 | 1 1 | 0 1 | 1 0 | 1 0 | 0 0 |

| R/C | A | B | C | D | E | F | G | H | I | J | K | L | M | N | O | P | Q | R |
|---|---|---|---|---|---|---|---|---|---|---|---|---|---|---|---|---|---|---|
| 0 | 0 | 1 | 0 | 0 | 0 | 0 | 0 | 1 | 1 | 0 | 0 | 0 | 1 | 0 | 1 | 1 | 1 | 1 |
| 1 | 0 | 0 | 1 | 1 | 0 | 0 | 1 | 1 | 1 | 1 | 1 | 0 | 0 | 0 | 1 | 1 | 1 | 0 |
| 2 | 0 | 0 | 0 | 0 | 1 | 0 | 1 | 0 | 1 | 0 | 0 | 1 | 1 | 0 | 0 | 0 | 1 | 1 |
| 3 | 0 | 1 | 1 | 1 | 1 | 1 | 0 | 0 | 0 | 1 | 0 | 0 | 1 | 1 | 0 | 0 | 0 | 1 |
| 4 | 0 | 0 | 1 | 0 | 1 | 1 | 0 | 1 | 0 | 1 | 0 | 1 | 1 | 1 | 1 | 0 | 0 | 0 |
| 5 | 1 | 1 | 1 | 0 | 1 | 1 | 1 | 1 | 1 | 1 | 1 | 0 | 0 | 0 | 0 | 0 | 0 | 1 |
| 6 | 0 | 1 | 0 | 0 | 0 | 1 | 1 | 0 | 1 | 1 | 1 | 1 | 1 | 0 | 1 | 0 | 0 | 1 |
| 7 | 0 | 1 | 0 | 0 | 0 | 0 | 0 | 1 | 1 | 1 | 0 | 0 | 1 | 0 | 1 | 1 | 1 | 1 |
| 8 | 0 | 1 | 0 | 1 | 1 | 1 | 1 | 1 | 1 | 1 | 1 | 1 | 0 | 1 | 1 | 0 | 1 | 0 |
| 9 | 1 | 0 | 0 | 0 | 1 | 0 | 1 | 0 | 0 | 1 | 0 | 1 | 0 | 1 | 0 | 0 | 0 | 0 |

| | Sym A | Sym B | Sym C | Sym D | Sym E | Sym F | Sym G | Sym H | Sym I | X |
|---|---|---|---|---|---|---|---|---|---|---|
| Sym 1 | 0 | 1 | 0 | 0 | 0 | 0 | 0 | 1 | 1 | 0 |
|       | 0 | 0 | 1 | 1 | 0 | 0 | 1 | 1 | 1 | 1 |
| Sym 2 | 0 | 0 | 0 | 0 | 1 | 0 | 1 | 0 | 1 | 0 |
|       | 0 | 1 | 1 | 1 | 1 | 1 | 0 | 0 | 0 | 1 |
| Sym 3 | 0 | 0 | 1 | 0 | 1 | 1 | 0 | 1 | 0 | 1 |
|       | 1 | 1 | 1 | 0 | 1 | 1 | 1 | 1 | 1 | 1 |
| Sym 4 | 0 | 1 | 0 | 0 | 0 | 1 | 1 | 0 | 1 | 1 |
|       | 0 | 1 | 0 | 0 | 0 | 0 | 0 | 1 | 1 | 1 |
| Sym 5 | 0 | 1 | 0 | 1 | 1 | 1 | 1 | 1 | 1 | 1 |
|       | 1 | 0 | 0 | 0 | 1 | 0 | 1 | 0 | 0 | 1 |

| | Sym A | Sym B | Sym C | Sym D | Sym E | Sym F | Sym G | Sym H | Sym I |
|---|---|---|---|---|---|---|---|---|---|
| Sym 1 | 1 | 0 | 1 | 0 | 0 | 0 | 0 | 1 | 1 |
|       | 0 | 0 | 0 | 1 | 1 | 0 | 1 | 1 | 1 |
| Sym 2 | 1 | 0 | 0 | 0 | 1 | 0 | 1 | 0 | 1 |
|       | 1 | 0 | 1 | 1 | 1 | 1 | 0 | 0 | 0 |
| Sym 3 | 0 | 0 | 1 | 0 | 1 | 1 | 0 | 1 | 0 |
|       | 1 | 1 | 1 | 0 | 1 | 1 | 1 | 1 | 1 |
| Sym 4 | 1 | 0 | 1 | 0 | 0 | 0 | 1 | 1 | 0 |
|       | 1 | 0 | 1 | 0 | 0 | 0 | 0 | 0 | 1 |
| Sym 5 | 0 | 0 | 1 | 0 | 1 | 1 | 1 | 1 | 1 |
|       | 0 | 1 | 0 | 0 | 0 | 1 | 0 | 1 | 0 |

... | Sym1, SymF | Sym1, SymG | Sym1, SymH | Sym2, SymA | Sym2, SymB | ... | Sym2, SymF | Sym2, SymG | Sym2, SymH | Sym3, SymA | Sym3, SymB | ...

SYSTEMS AND METHODS FOR SYMBOL RE-GROUPING DECODING PROCESSING

BACKGROUND OF THE INVENTION

The present invention is related to systems and methods for performing data processing, and more specifically to systems and methods for applying a data decode algorithm to different rotations of a decoder input as part of data processing.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. In some cases, the allowed number of iterations through the data decoder and data detector circuits may not yield a correct result.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for applying a data decode algorithm to different rotations of a decoder input as part of data processing.

Various embodiments of the present invention provide data processing systems that include a data decoding system. The data decoding system is operable to: modify a decoder input using a first modification algorithm to yield a first modified output; modify the decoder input using a second modification algorithm to yield a second modified output; apply a data decode algorithm by a data decoder circuit to the first modified output to yield a first decoded output; apply the data decode algorithm by the data decoder circuit to the second modified output to yield a second decoded output; and select one of the first decoded output as a selected decoding result based at least in part on a first characteristic of the second decoded output and a second characteristic of the second decoded output. In some embodiments of the present invention, the data decode algorithm is a low density parity check algorithm. In some cases, the data processing system is implemented as part of a storage device or a receiving device. In one or more cases, the data processing system is implemented as part of an integrated circuit.

In some instances of the aforementioned embodiments, the first characteristic is a first number of unsatisfied checks corresponding to the first decoded output, and the second characteristic is a second number of unsatisfied checks corresponding to the second decoded output. In some such instances, the data decoding system is further operable to: determine the first number of unsatisfied checks corresponding to the first decoded output; and determine the second number of unsatisfied checks corresponding to the second decoded output. In some cases of the aforementioned instances, selecting the one of the first decoded output and the second decoded includes: selecting the first decoded output as the selected decoding result when the first number of unsatisfied checks is less than the second number of unsatisfied checks; and selecting the second decoded output as the selected decoding result when the second number of unsatisfied checks is less than the first number of unsatisfied checks.

In various instances of the aforementioned embodiments, the data decoding system is further operable to: re-apply the data decode algorithm to the first modified output guided by the selected decoding result to yield a third decoded output; and re-apply the data decode algorithm to the second modified output guided by the selected decoding result to yield a fourth decoded output.

In various instances of the aforementioned embodiments, the decoder input includes a number of non-binary symbols. In particular cases, the non-binary symbols each include four bits. In various cases, the bits in the non-binary symbols are arranged in columns, and each of the non-binary symbols in the first modified output include bits from consecutive columns. In one or more cases, at least one of the non-binary symbols in the second modified output include bits from non-consecutive columns. In one or more instances of the aforementioned embodiments, the first modification algorithm is a pass through algorithm such that the first modified output is the same as the decoder input. In some such instances, the second modification algorithm is a rotation algorithm such that the second modified output is a rotated version of the decoder input.

Other embodiments of the present invention provide methods that include: modifying a decoder input using a modification algorithm to yield a modified output; applying a data decode algorithm by a data decoder circuit to the decoder input to yield a first decoded output; applying the data decode algorithm by the data decoder circuit to the modified output to yield a second decoded output; and selecting one of the first decoded output as a selected decoding result based at least in part on a first number of unsatisfied checks in the first decoded output and a second number of unsatisfied checks in the second decoded output. In some instances of the aforementioned embodiments, the methods further include: re-applying the data decode algorithm to the first modified output guided by the selected decoding result to yield a third decoded output; and re-applying the data decode algorithm to the second modified output guided by the selected decoding result to yield a fourth decoded output. In various instances of the aforementioned embodiments, the methods further include: determining the first number of unsatisfied checks corresponding to the first decoded output; and determining the second number of unsatisfied checks corresponding to the second decoded output. In some particular instances of the aforementioned embodiments, the decoder input includes a number of non-binary symbols, and bits in the non-binary symbols are arranged in columns. In some such instances, each of the non-binary symbols in the modified output include bits from non-consecutive columns.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 2-3 show examples of two different rotations of a decoder input that may be used in relation to various embodiments of the present invention;

DETAILED DESCRIPTION OF THE INVENTION

Figure 1:
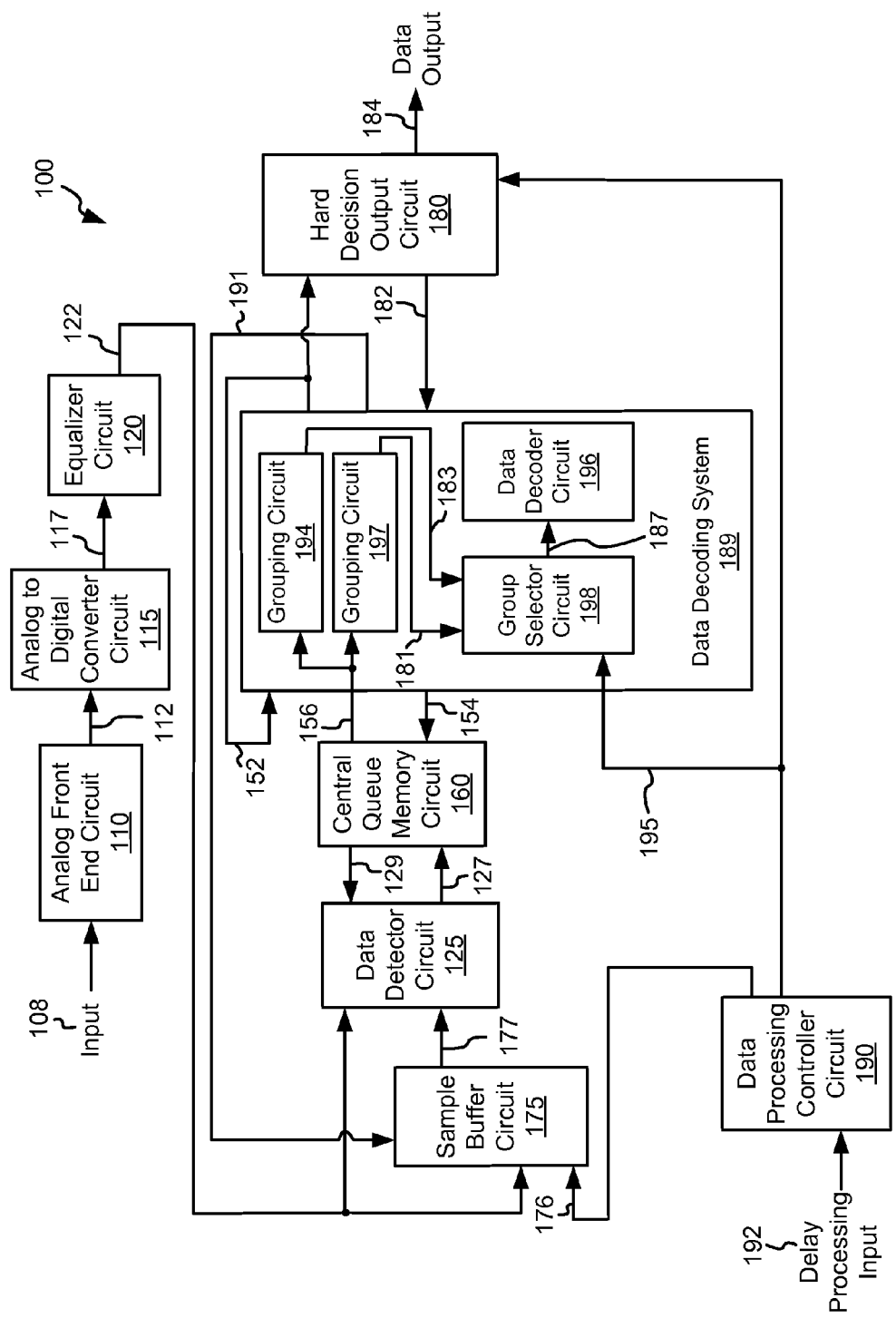
FIG. 1 depicts a data processing circuit having decoder input rotating circuitry in accordance with some embodiments of the present invention.

The present invention is related to systems and methods for performing data processing, and more specifically to systems and methods for applying a data decode algorithm to different rotations of a decoder input as part of data processing.

Various embodiments of the present invention provide for modifying a data decoding process when delay processing is desired. Such delay processing is done when a reduction in the processing requirements of a data processing circuit occurs, thereby allowing application of otherwise unused processing resources to be used on previously non-converging data sets. Such a reduction in the processing requirements of the data processing circuit may occur, for example, due to a change in tracks when accessing data from a storage medium or an end of transmission of a data transmission device that result in a reduction in the volume of data introduced to the data decoding process. Based upon the disclosure provided herein, one of ordinary skill in the art will recognize a variety of scenarios that may result in under-use of the data processing circuit. It should also be noted that the modified decoding process discussed in this application may be applied in situations not involving under-use as well.

In particular embodiments of the present invention, data processing is applied to a given data set until either the processing converges (i.e., arrives at a correct result) or a timeout condition is met. Where a timeout condition is met, the data set may be maintained until a later time when additional processing time and/or resources are available. This additional processing time may be, but is not limited to, a track change. Once the additional processing time is available, a data decoding algorithm is applied to a decoder input in a first rotation to yield a first decoded output. The data decoding algorithm is also applied to a decoder input in a second rotation to yield a second decoded output. As one example, the decoder input in the first rotation may be a non-binary decoder input with each non-binary symbol including elements described by the following equation:

$$Symbol_i = \{Element_{row+i,column}, Element_{row+i+1,column}, Element_{row+i,column+1}, Element_{row+i+1,column+1}\},$$

where the row and column indicate a location of the elements of a symbol relative to an array in which a codeword is arranged. Similarly, the decoder input in the second rotation is the same decoder input as before, only grouped differently. For example, the decoder input in the second rotation may be a non-binary decoder input with each non-binary symbol including elements described by the following equation:

$$Symbol_i = \{Element_{row+i+1,column}, Element_{row+i+2,column}, Element_{row+i+1,column+1}, Element_{row+i+2,column+1}\}.$$

It should be noted that while the aforementioned equations imply four bit symbols, that other numbers of bits may be used for symbol sizes. The number of unsatisfied checks remaining in the first decoder output is compared with the number remaining in the second decoder output. Where the number of unsatisfied checks remaining in the second decoder output is greater than the number remaining in the first decoder output, the first decoder output is selected for future processing. Otherwise, the second decoder output is selected. As used herein, the terms "rotate", "rotating" or "rotation" are used in their broadest sense to mean any rearrangement of a data set. As one example such rotating or rotation includes re-grouping symbols. In one particular case, two different symbol groupings are used—one using a standard grouping across consecutive columns, and another where the first symbol includes some bits from one column and some bits from a non-consecutive symbol. Based upon the disclosure provided herein, one of ordinary skill in the art will recognize a variety of modifications that may be considered rotations within the scope of the present application.

Turning to FIG. 1, a data processing circuit 100 having decoder input rotating circuitry circuitry is shown in accordance with some embodiments of the present invention. Data processing circuit 100 includes an analog front end circuit 110 that receives an analog input 108. Analog front end circuit 110 processes analog input 108 and provides a processed analog signal 112 to an analog to digital converter circuit 115. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog input 108 is derived from a read/write head assembly (not shown) that is disposed in relation to a storage medium (not shown). In other cases, analog input 108 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 308 may be derived.

Analog to digital converter circuit 115 converts processed analog signal 112 into a corresponding series of digital samples 117. Analog to digital converter circuit 115 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 117 are provided to an equalizer circuit 120. Equalizer circuit 120 applies an equalization algorithm to digital samples 117 to yield an equalized output 122. In some embodiments of the present invention, equalizer circuit 120 is a digital finite impulse response filter circuit as are known in the art.

Equalized output 122 is provided to both a data detector circuit 125 and to a sample buffer circuit 175. Sample buffer circuit 175 stores equalized output 122 as buffered data 177 for use in subsequent iterations through data detector circuit 125. Data detector circuit 125 may be any data detector circuit known in the art that is capable of producing a detected output 127. As some examples, data detector circuit 125 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 127 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 127 is provided to a central queue memory circuit 160 that operates to buffer data passed between data detector circuit 125 and a data decoding system 189. In some cases, central queue memory circuit 160 includes interleaving (i.e., data shuffling) and de-interleaving (i.e., data un-shuffling) circuitry known in the art. When a data decoding system 189 is available, data decoding system 189 accesses detected output 127 from central queue memory circuit 160 as a decoder input 156. Data decoding system 189 provides decoder input 156 to a grouping circuit 194 and a grouping circuit 197.

Grouping circuit 194 provides a first rotated decoder input 183 which is a first rotation of decoder input 156. In one particular embodiment of the present invention, the first rotation is a non-rotation. In such a case, grouping circuit 194 is a pass through circuit that provides decoder input 156 as first rotated decoder input 183. An example of a decoder input without rotation is described in FIGS. 2a-2c where the symbols introduced to the data decoder circuit are described in accordance with the following equation:

$$Symbol_i = \{Element_{row+i,column}, Element_{row+i+1,column}, Element_{row+i,column+1}, Element_{row+i+1,column+1}\},$$

where the row and column indicate a location of the elements of a symbol relative to an array in which a codeword is arranged. Again, it should be noted that while the aforementioned equations imply four bit symbols, that other numbers of bits may be used for symbol sizes. Characteristic of such a non-rotated decoder input is that the first symbol in a row includes elements from consecutive columns.

Grouping circuit 197 provides a second rotated decoder input 181 which is a second rotation of decoder input 156. In one particular embodiment of the present invention, the second rotation is an offset rotation. An example of a decoder input with such offset rotation is described in FIGS. 3a-3d where the symbols introduced to the data decoder circuit are described in accordance with the following equation:

$$Symbol_i = \{Element_{row+i+1,column}, Element_{row+i+2,column}, Element_{row+i+1,column+1}, Element_{row+i+2,column+1}\}.$$

Again, it should be noted that while the aforementioned equations imply four bit symbols, that other numbers of bits may be used for symbol sizes. Characteristic of such a rotated decoder input is that the first symbol in a row includes elements from non-consecutive columns resulting from a rotation or offset. This offset is continued across subsequent symbols in a given row.

During standard processing indicated by de-assertion of a delay processing signal 195, a group selector circuit 198 selects first rotated decoder input 183 as a decoder input 187. A data processing controller circuit 190 is operable to de-assert delay processing signal 195 whenever a delay processing input 192 is de-asserted, and to assert delay processing signal 195 upon assertion of delay processing input 192.

A data decoder circuit 196 is operable to apply a data decode algorithm to decoder input 187 to yield a decoded output 152. Similar to detected output 127, decoded output 152 may include both hard decisions and soft decisions. For example, data decoder circuit 196 may be any data decoder circuit known in the art that is capable of applying a decoding algorithm to a received input. Data decoder circuit 196 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, decoded output 152 is stored to a memory included in a hard decision output circuit 180. In turn, hard decision output circuit 180 provides the converged decoded output 152 as a data output 184 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data was not recovered (i.e., the data decoding algorithm failed to converge) prior to a timeout condition, decoded output 152 indicates that the data is unusable as is more specifically discussed below, and data output 184 is similarly identified as unusable.

One or more iterations through the combination of data detector circuit 125 and data decoder circuit 196 may be made in an effort to converge on the originally written data set. Processing through both the data detector circuit and the data decoder circuit is referred to as a "global iteration". In contrast, each pass through the data decoder circuit is referred to as a "local iteration". For the first global iteration, data detector circuit 125 applies the data detection algorithm to equalized output 122 without guidance from a decoded output. For subsequent global iterations, data detector circuit 125 applies the data detection algorithm to buffered data 177 as guided by decoded output 152. Decoded output 152 is stored to central queue memory circuit 160 as a decoder output 154, and is provided from central queue memory circuit 160 as a detector input 129.

During each global iteration it is possible for data decoder circuit 196 to make one or more local iterations including application of the data decoding algorithm to decoder input 156. For the first local iteration, data decoder circuit 196 applies the data decoder algorithm without guidance from decoded output 152. For subsequent local iterations, data decoder circuit 196 applies the data decoding algorithm to decoder input 156 as guided by a previous decoded output 152. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 196 exceeds that allowed, but it is determined that at least one additional global iteration during standard processing of the data set is allowed, decoded output 152 is provided back to central queue memory circuit 160 as decoded output 154. Decoded output 154 is maintained in central queue memory circuit 160 until data detector circuit 125 becomes available to perform additional processing.

In contrast, where the number of local iterations through data decoder circuit 196 exceeds that allowed and it is determined that the allowable number of global iterations has been surpassed for the data set and/or a timeout or memory usage calls for termination of processing of the particular data set, standard processing of the data set concludes and the decoded output is provided as data output 152 with an indication that the output is unusable. In such a case where standard processing of the data set has concluded, the un-converged data set (i.e., that provided as data output 152) is stored in the memory of hard decision output circuit 180, and the sample data (i.e., that maintained in sample buffer circuit 175) corresponding to the un-converged data set is maintained in sample buffer circuit 175 for at least a defined period awaiting an indication of delay processing by assertion of delay processing input 192. In addition, the un-converged data set and the corresponding sample data are identified for delay processing as indicated by assertion of a retain signal 191. Again, delay processing is signaled by the assertion of delay processing input 192.

During delay processing as indicated by assertion of delay processing input 192, one of the sample data sets corresponding to the previously un-converged data sets that remains in sample buffer circuit 175 is accessed as indicated by a control output 176 from data processing controller circuit 190. In addition, data processing controller circuit 190 asserts delay processing signal 195 to data decoding system 189 and a hard decision output circuit 180. Data detector circuit 125 re-applies the data detection algorithm to the sample set identified for delay processing and accessed as indicated by control output 176 to yield detected output 127. Detected output 127 is stored to central queue memory circuit 160.

Once data decoding system 189 becomes available, data decoding system 189 accesses detected output 127 from central queue memory circuit 160 as a decoder input 156. In addition, data decoding system 189 accesses a corresponding decoded output 182 that was previously stored to the memory of hard decision output circuit 180. On a first pass, group selector circuit 198 selects first rotated decoder input 183 as decoder input 187, and data decoder circuit 196 applies the data decode algorithm to decoder input 187 to yield a first decoded output that is stored back to central memory queue 160 as a decoder input 154. On a second pass, group selector circuit 198 selects second rotated decoder input 181 as decoder input 187, and data decoder circuit 196 applies the data decode algorithm to decoder input 187 to yield a second decoded output that is stored back to central memory queue 160 as a decoder input 154.

Data decoding system 189 then determines a first number of unsatisfied checks in the first decoded output, and second number of unsatisfied checks in the second decoded output. Data decoding system 189 then compares the first number of unsatisfied checks and the second number of unsatisfied checks. Where the first number of unsatisfied checks associated with non-rotated decoder input 183 is less than the second number of unsatisfied checks associated with rotated decoder input 181, the first decoded output is retained for use in guiding future data detection and/or data decoding. Otherwise, the second decoded output is retained for use in guiding future data detection and/or data decoding.

Where another local iteration through data decoder circuit 196 is allowed, the aforementioned process of applying the data decode algorithm to the non-rotated decoder input 183 and to the rotated decoder input 181 guided by the previously retained data decode result. This process is repeated until either one of the first decoded output or the second decoded output converges, a maximum number of local iterations for the current global iteration have completed, or a timeout condition is met. Where a timeout condition is met, an error is reported. The error condition may be met when a maximum number of global iterations have been exhausted. Based upon the disclosure provided herein, one of ordinary skill in the art will recognize a variety of other circumstances in which a timeout condition may be considered to have been met. Where the maximum number of local iterations has been met, the data detection algorithm is applied to the data input from sample buffer circuit 175 guided by the retained result, and the process of decoding begins again. Where either the first decoded output or the second decoded output converges, the converged result is provided as a data output.

Figures 2A, 2B, 2C:
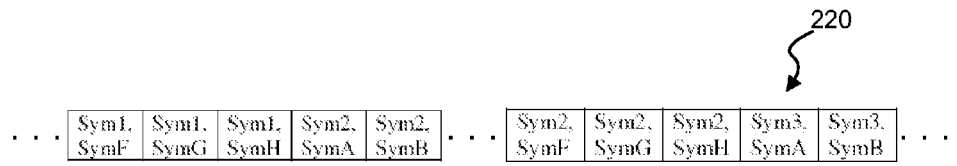

Turning to FIGS. 2a-2c, an example of a non-rotated decoder input that may be used in relation to various embodiments of the present invention is shown. FIG. 2a graphically depicts an array 200 corresponding to an example data set derived from a detected output. As shown, the array 200 is two dimension having ten (10) rows and eighteen (18) columns. As shown in an array 210 representing a non-rotated decoder input, the data set represented in array 200 is organized into four bit symbols designated by a column number (SymA-SymI) and a row number (Sym1-Sym5). Each of the four bit symbols are described in accordance with the following equation:

$$Symbol_i = \{Element_{row+i,column}, Element_{row+i+1,column}, Element_{row+i,column+1}, Element_{row+i+1,column+1}\},$$

where the row and column indicate a location of the elements of a symbol relative to an array in which a codeword is arranged. It should be noted that while the aforementioned equations and figures are directed to four bit symbols, that other numbers of bits may be used for symbol sizes. Characteristic of such a non-rotated decoder input is that the first symbol in a row includes elements from consecutive columns (e.g., columns A, B designated as SymB). This alignment continues across the row with the next symbol being drawn form the next consecutive columns (e.g., columns C, D designated as SymB; columns E, F designated as SymC; columns G, H designated as SymD; columns I, J designated as SymE; columns K, L designated as SymF; columns M, N designated as SymG; columns O, P designated as SymH; and columns Q, R designated as SymI). These symbols are provided in serial as a decoder input 220 to a data decoder circuit as shown in FIG. 2c.

Turning to FIGS. 3a-3d, an example of a rotated decoder input that may be used in relation to various embodiments of the present invention is shown. FIG. 3a graphically depicts array 200 corresponding to an example data set derived from a detected output that is the same as that shown in FIG. 2a discussed above. Again, array 200 is two dimension having ten (10) rows and eighteen (18) columns. As shown in an array 310 representing a rotated decoder input, the data set represented in array 200 is organized into four bit symbols designated by a column number (SymA-SymI and X) and a row number (Sym1-Sym5). Each of the four bit symbols are described in accordance with the following equation:

$$Symbol_i = \{Element_{row+i+1,column}, Element_{row+i+2,column}, Element_{row+i+1,column+1}, Element_{row+i+2,column+1}\}.$$

It should be noted that while the aforementioned equations imply four bit symbols, that other numbers of bits may be used for symbol sizes. Characteristic of such a rotated decoder input is that the first symbol in a row includes elements from non-consecutive columns (e.g., columns R, A designated as SymA). In particular, the last column identified as X is used as the first column as indicated by an arrow 315, and all of the other columns are shifted to the right by one. This alignment continues across the row with the next symbol being drawn form the next consecutive columns (e.g., columns B, C designated as SymB; columns D, E designated as SymC; columns F, G designated as SymD; columns H, I designated as SymE; columns J, K designated as SymF; columns L, M designated as SymG; columns N, O designated as SymH; and columns P, Q designated as SymI). FIG. 3c shows a data set 320 with the rotation of the last column to the first column to be included in SymA. The symbols as organized in data set 320 represent a rotated decoder input. The symbols in data set 320 are provided in serial as a decoder input 330 to a data decoder circuit as shown in FIG. 3d.

Figure 4A:
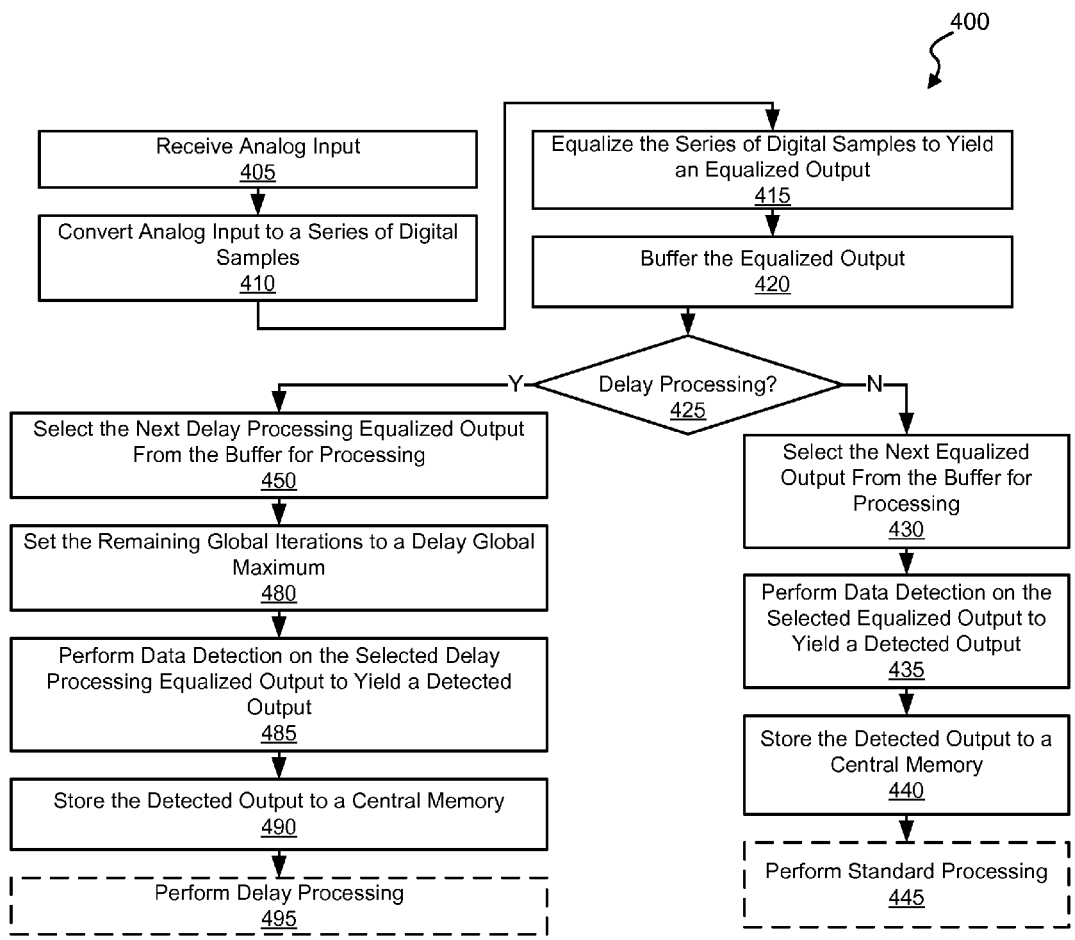
FIGS. 4a-4c are flow diagrams showing a method in accordance with some embodiments of the present invention for rotated input decoding processing.
Figure 4B:
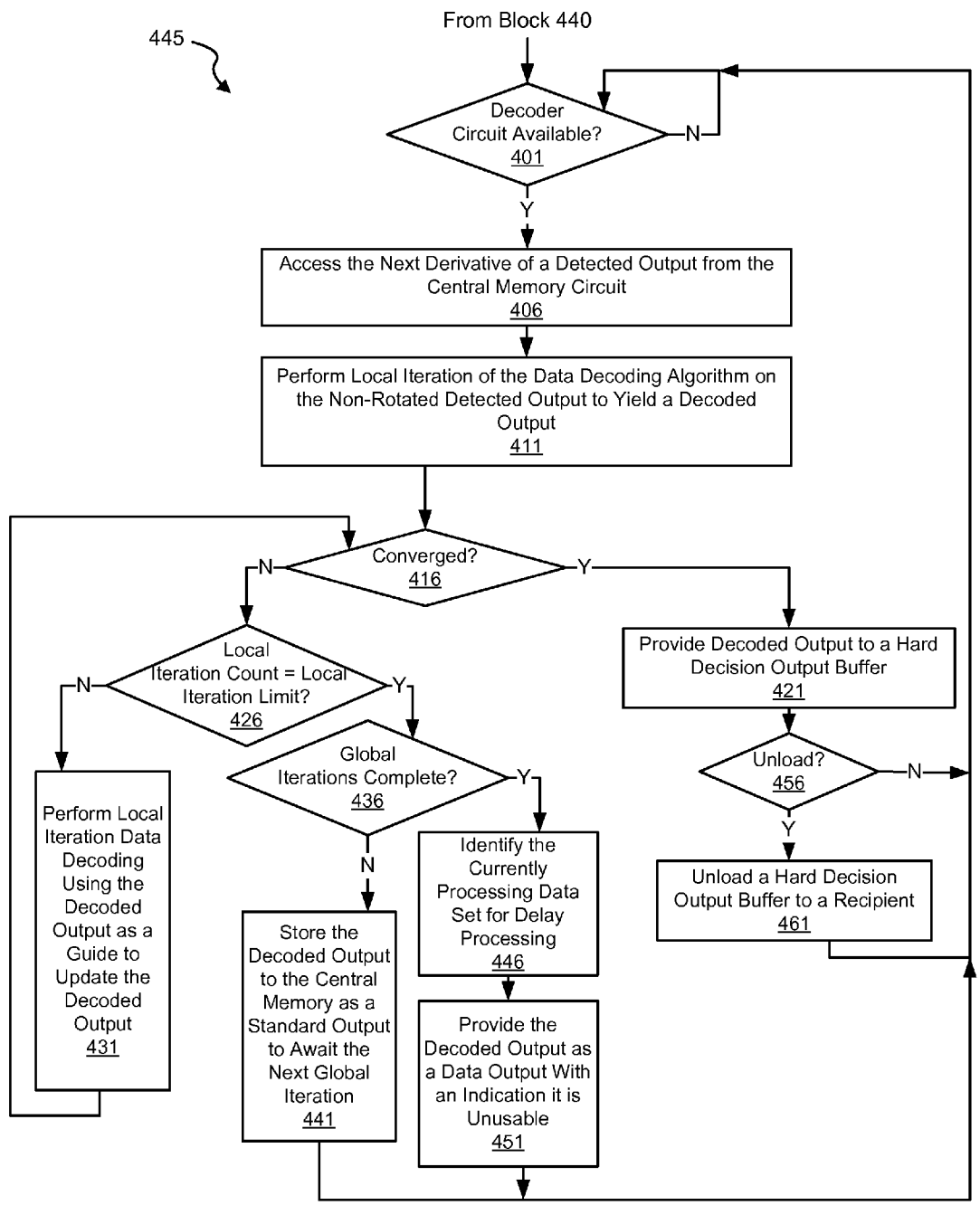
Figure 4C:
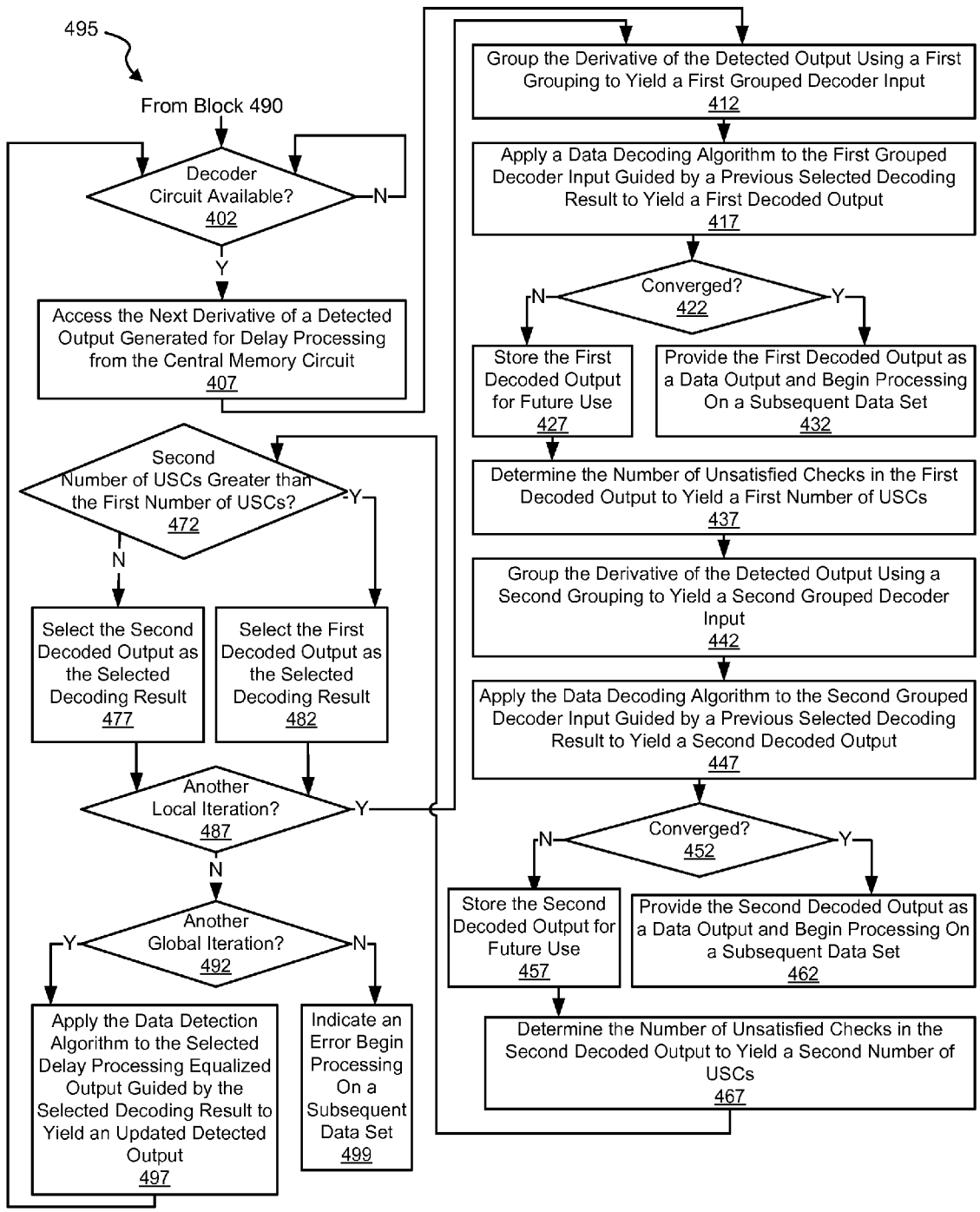

Turning to FIG. 4a-4c, flow diagrams 400, 445, 470 show a method in accordance with some embodiments of the present invention for dual binary and non-binary decoding processing. Turning to FIG. 4a and following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether delay processing is desired (block 425). Such delay processing is selected when a reduction in the processing requirements of a data processing circuit occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of the data processing circuit.

Where delay processing is not desired (block 425), standard processing is applied. This standard processing includes selecting the next equalized output from the buffer for processing (block 430). This selection may be done in accordance with any data processing circuit selection algorithm known in the art. A data detection algorithm is applied to the selected equalized output to yield a detected output (block 435), and the detected output (or a derivative thereof) is stored to a central memory circuit (block 440). This stored data may then be accessed from the central memory for performance of standard processing (flow diagram 445). This standard processing is done in accordance with flow diagram 445 of FIG. 4b.

Where delay processing is desired (block 425), delay processing is applied. This delay processing includes selecting the next delay processing equalized output from the buffer for processing (block 450). The delay processing equalized output is selected from one or more data sets that failed to converge during standard processing. The number of remaining global iterations to be applied to the currently processing data set is set equal to a delay global maximum (block 480). In some embodiments of the present invention, the delay global maximum is twenty (20). A data detection algorithm is applied to the selected delay processing equalized output to yield a detected output (block 485), and the detected output (or a data set derived there from) is stored to a central memory circuit (block 490). In some cases, the store derivative of the detected output is an interleaved or shuffled version of the detected output. This stored data may then be accessed from the central memory for performance of delay processing (flow diagram 495 of FIG. 4c).

Turning to FIG. 4b, flow diagram 445 shows an implementation of the aforementioned standard processing. Following flow diagram 445, it is determined whether a decoder circuit is available to process a previously stored detected output (block 401). Where the decoder circuit is available (block 401), the next derivative of a detected output is selected for processing and accessed from the central memory circuit (block 406). A first local iteration of a data decoding algorithm is applied by the data decoder circuit to the selected detected output to yield a decoded output (block 411). In some embodiments of the present invention, the selected detected output is processed without any rotation. An example of a decoder input without rotation was described in FIGS. 2a-2c where the symbols introduced to the data decoder circuit are described in accordance with the following equation:

$$\text{Symbol}_i = \{\text{Element}_{row+i,column}, \text{Element}_{row+i+1,column}, \text{Element}_{row+i,column+1}, \text{Element}_{row+i+1,column+1}\},$$

where the row and column indicate a location of the elements of a symbol relative to an array in which a codeword is arranged. Again, it should be noted that while the aforementioned equations imply four bit symbols, that other numbers of bits may be used for symbol sizes. Characteristic of such a non-rotated decoder input is that the first symbol in a row includes elements from consecutive columns.

It is then determined whether the decoded output converged (i.e., yielded a correct result) (block 416). Where the decoded output converged (block 416), the decoded output is provided to a hard decision output buffer (block 421). It is then determined whether the hard decision output buffer is ready to be unloaded (block 456). In some cases, the hard decision output buffer is ready to be unloaded when the most recently completed decoded output is the next decoded output after that previously provided as a data output. Where the hard decision output buffer is ready to be unloaded (block 456), all of the continuous decoded outputs maintained in the hard decision output buffer are provided as a data output to a recipient device (block 461). Based upon the disclosure provided herein, one of ordinary skill in the art will recognize a variety of recipient devices that may be used in relation to different embodiments of the present invention.

Alternatively, where the non-binary decoded output failed to converge (block 416), it is determined whether the local iteration count has exceeded a local iteration limit (block 426). This local iteration limit may be, for example, ten (10) local iterations. Where the number of local iterations has not yet been exceeded (block 426), the data decoding algorithm is re-applied to the currently processing data set for a subsequent local iteration guided by the previously generated decoded output to yield an updated decoded output (block 431). The processes beginning at block 416 are then repeated.

Alternatively, where the number of local iterations for the currently proceeding global iteration have been exceeded (block 426), it is determined if the maximum number of global iterations have already been applied to the currently processing data set (block 436). The number of global iterations may be complete where, for example, a timeout condition has occurred or a memory usage limitation has been exceeded. Where the global iterations are not complete (block 436), the decoded output is stored to the central memory as a standard output where it awaits processing in a subsequent global iteration (block 441). Alternatively, where the global iterations are complete (block 436), the currently processing data set is identified for delay processing (i.e., processing during a delay processing period) (block 446), and the non-binary decoded output is provided as a data output marked as unusable (block 451).

Turning to FIG. 4c, flow diagram 495 shows an implementation of the aforementioned delay processing. Following flow diagram 495, it is determined whether a decoder circuit is available to process a previously stored detected output (block 402). Where the decoder circuit is available (block 402), the next derivative of a detected output generated for delay processing (i.e., identified for delay processing in block 446) is selected for processing and accessed from the central memory circuit (block 407). The accessed derivative of the detected output is grouped according to a first grouping to yield a first grouped decoder input (block 412). In some embodiments of the present invention, the first grouping is a non-rotated grouping. An example of a decoder input without rotation was described in FIGS. 2a-2c where the symbols introduced to the data decoder circuit are described in accordance with the following equation:

$$\text{Symbol}_i = \{\text{Element}_{row+i,column}, \text{Element}_{row+i+1,column}, \text{Element}_{row+i,column+1}, \text{Element}_{row+i+1,column+1}\},$$

where the row and column indicate a location of the elements of a symbol relative to an array in which a codeword is arranged. Again, it should be noted that while the aforementioned equations imply four bit symbols, that other numbers of bits may be used for symbol sizes. Characteristic of such a non-rotated decoder input is that the first symbol in a row includes elements from consecutive columns. The data decoding algorithm is then applied to the first grouped decoder input guided by a previous selected decoding result to yield a first decoded output (block 417). For the first local iteration of the delay processing, the previous selected decoding result is the decoded output stored in the output buffer from block 451. For subsequent local iterations, the previous selected decoding result is the selected one of either the decoded output resulting from a decoder input rotated in accordance with a first grouping (block 482) or the decoded output resulting from a decoder input rotated in accordance with a second grouping (block 477).

It is determined whether the first decoded output converged (i.e., yielded a correct result) (block 422). Where the first decoded output converged (block 422), the first decoded output is provided as a data output and another global iteration operating on a subsequent data set begins (block 432). Otherwise, where the first decoded output failed to converge (block 422), the first decoded output is stored for future use (block 427). The first decoded output may be stored, for example, in an unused portion of an output buffer, a central memory buffer, or an input buffer. In addition, the number of unsatisfied checks (e.g., parity equations that remain unsatisfied) in the first decoded output are determined (block 437). This may be done by counting the number of parity check equations in the first decoded output that remain unsatisfied.

Next, the accessed derivative of the detected output is grouped according to a second grouping to yield a second grouped decoder input (block 442). In some embodiments of the present invention, the second grouping is a rotated grouping. An example of a decoder input with rotation was described in FIGS. 3a-3d where the symbols introduced to the data decoder circuit are described in accordance with the following equation:

$$\text{Symbol}_i = \{\text{Element}_{row+i+1,column}, \text{Element}_{row+i+2,column}, \text{Element}_{row+i+1,column+1}, \text{Element}_{row+i+2, column+1}\}.$$

Again, it should be noted that while the aforementioned equations imply four bit symbols, that other numbers of bits may be used for symbol sizes. Characteristic of such a rotated decoder input is that the first symbol in a row includes elements from non-consecutive columns resulting from a rotation or offset. This offset is continued across subsequent symbols in a given row. The data decoding algorithm is then applied to the second grouped decoder input guided by a previous selected decoding result to yield a second decoded output (block 447). For the second local iteration of the delay processing, the previous selected decoding result is the decoded output stored in the output buffer from block 451. For subsequent local iterations, the previous selected decoding result is the selected one of either the decoded output resulting from the decoder input rotated in accordance with the first grouping (block 482) or the decoded output resulting from the decoder input rotated in accordance with the second grouping (block 477).

It is determined whether the second decoded output converged (i.e., yielded a correct result) (block 452). Where the second decoded output converged (block 452), the second decoded output is provided as a data output and another global iteration operating on a subsequent data set begins (block 462). Otherwise, where the second decoded output failed to converge (block 452), the second decoded output is stored for future use (block 457). The second decoded output may be stored, for example, in an unused portion of an output buffer, a central memory buffer, or an input buffer. In addition, the number of unsatisfied checks (e.g., parity equations that remain unsatisfied) in the second decoded output are determined (block 437). This may be done by counting the number of parity check equations in the second decoded output that remain unsatisfied.

It is determined whether the second number of unsatisfied checks is greater than the first number of unsatisfied checks (block 472). Where the second number of unsatisfied checks is greater than the first number of unsatisfied checks (block 472), the first decoded output from block 417 is selected as the selected decoding result (block 482). Otherwise, where the second number of unsatisfied checks is not greater than the first number of unsatisfied checks (block 472), the second decoded output from block 447 is selected as the selected decoding result (block 477).

It is then determined whether another local iteration is allowed (block 487). Where another local iteration is allowed (block 487), the processes beginning at block 412 are repeated using the newly selected decoding result. Otherwise, where another local iteration is not allowed (block 487), it is determined whether another global iteration is allowed (block 492). Where another global iteration is not allowed (block 492), an error is indicated and processing on a subsequent data set begins (block 499). Otherwise, where another global iteration is allowed (block 492), the data detection algorithm is applied to the selected delay processing equalized output guided by the selected decoding result to yield an updated detected output (block 497), and the processes beginning at block 402 are re-started for the same data set.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

Figure 5:
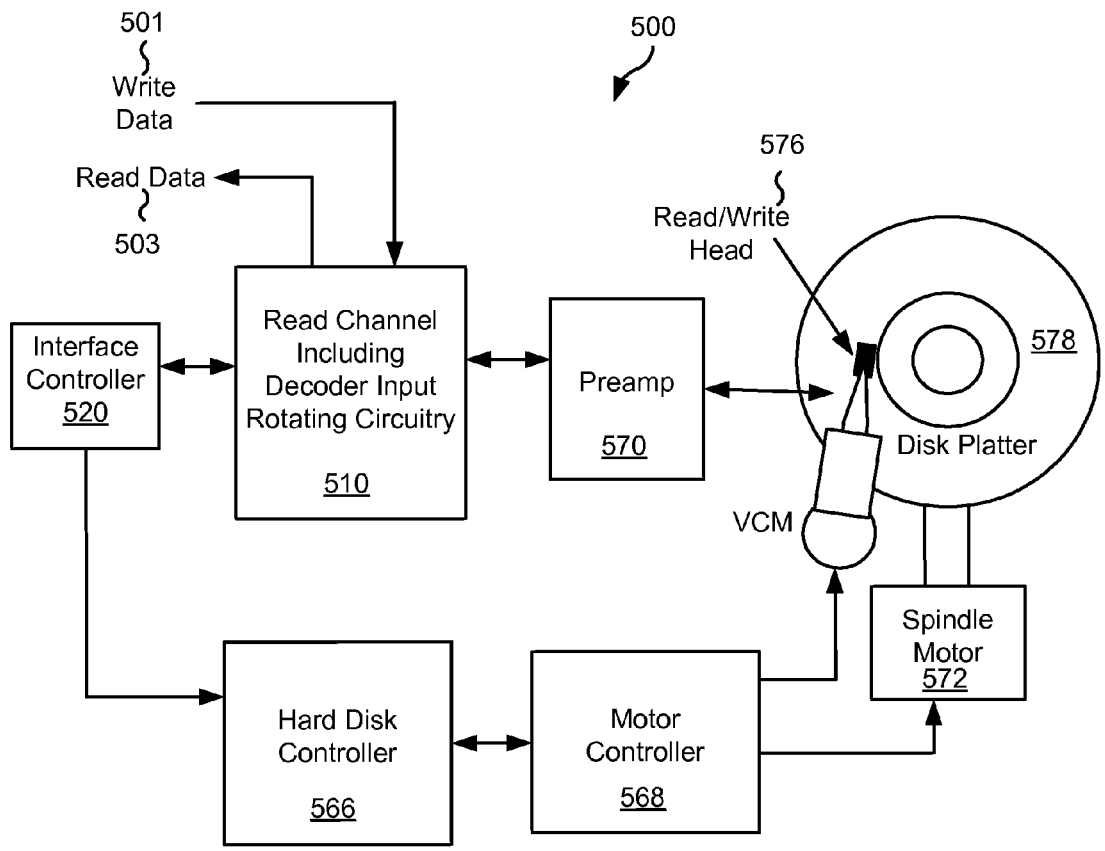
FIG. 5 shows a storage device including a read channel having decoder input rotating circuitry in accordance with one or more embodiments of the present invention.

Turning to FIG. 5, a storage system 500 including a read channel circuit 510 having decoder input rotating circuitry is shown in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. A write operation is substantially the opposite of the preceding read operation with write data 501 being provided to read channel circuit 510. This data is then encoded and written to disk platter 578.

During operation, data is sensed from disk platter 578 and processed using a standard processing. Such standard processing may be done using one rotation of a decoder input. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time when read/write head assembly 576 is moved from a current track to another track. During this delay processing period, the combination of the non-converging data set and the corresponding non-detected/decoded data set are accessed for reprocessing. The reprocessing includes performing data decoding on the decoder input in the original rotation to yield a first decoded output, and performing data decoding on the decoder input in another rotation to yield a second decoded output. The number of unsatisfied checks remaining in the first decoder output is compared with the number remaining in the second decoder output. Where the number of unsatisfied checks remaining in the second decoder output is greater than the number remaining in the first decoder output, the first decoder output is selected for future processing. Otherwise, the second decoder output is selected. In some embodiments of the present invention, data processing circuits similar to that discussed above in relation to FIG. 1 may be used, and/or the processing may be done similar to that discussed above in relation to FIGS. 4a-4c.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 510 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 6:
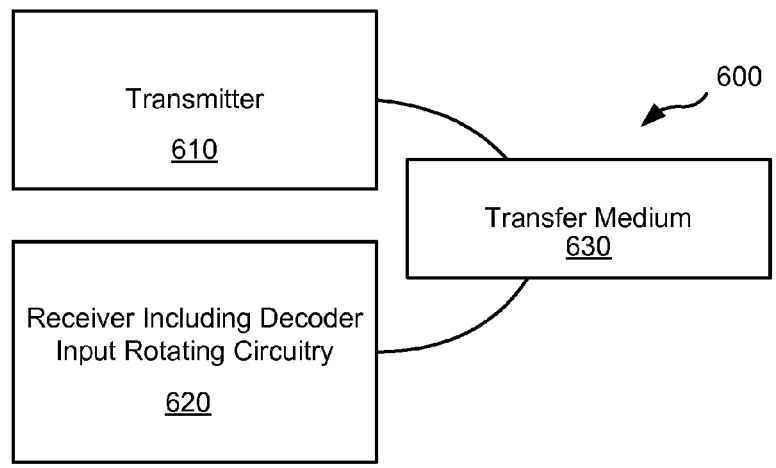
FIG. 6 shows a data transmission device including a receiver having decoder input rotating circuitry in accordance with some embodiments of the present invention.

Turning to FIG. 6, a data transmission device 600 including a receiver 620 having decoder input rotating circuitry is shown in accordance with some embodiments of the present invention. Data transmission system 600 includes a transmitter 610 that is operable to transmit encoded information via a transfer medium 630 as is known in the art. The encoded data is received from transfer medium 630 by receiver 620.

During operation, data is received by receiver 620 via transfer medium 630 and processed using a standard processing. Such standard processing may be done using one rotation of a decoder input. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time when no transmission is ongoing via transfer medium 630. During this delay processing period, the combination of the non-converging data set and the corresponding non-detected/decoded data set are accessed for reprocessing. The reprocessing includes performing data decoding on the decoder input in the original rotation to yield a first decoded output, and performing data decoding on the decoder input in another rotation to yield a second decoded output. The number of unsatisfied checks remaining in the first decoder output is compared with the number remaining in the second decoder output. Where the number of unsatisfied checks remaining in the second decoder output is greater than the number remaining in the first decoder output, the first decoder output is selected for future processing. Otherwise, the second decoder output is selected. In some embodiments of the present invention, data processing circuits similar to that discussed above in relation to FIG. 1 may be used, and/or the processing may be done similar to that discussed above in relation to FIGS. 4a-4c.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data decoding system operable to:
      modify a decoder input corresponding to a codeword using a first modification algorithm to yield a first modified output;
      modify the decoder input corresponding to the codeword using a second modification algorithm to yield a second modified output, wherein the first modification algorithm is distinct from the second modification algorithm;
      apply a data decode algorithm by a data decoder circuit to the first modified output to yield a first decoded output;
      apply the data decode algorithm by the data decoder circuit to the second modified output to yield a second decoded output; and
      select one of the first decoded output as a selected decoding result based at least in part on a first characteristic of the second decoded output and a second characteristic of the second decoded output.

2. The data processing system of claim 1, wherein the first characteristic is a first number of unsatisfied checks corresponding to the first decoded output, wherein the second characteristic is a second number of unsatisfied checks corresponding to the second decoded output, and wherein the data decoding system is further operable to:
   determine the first number of unsatisfied checks corresponding to the first decoded output; and
   determine the second number of unsatisfied checks corresponding to the second decoded output.

3. The data processing system of claim 2, wherein selecting the one of the first decoded output and the second decoded comprises:
   selecting the first decoded output as the selected decoding result when the first number of unsatisfied checks is less than the second number of unsatisfied checks; and
   selecting the second decoded output as the selected decoding result when the second number of unsatisfied checks is less than the first number of unsatisfied checks.

4. The data processing system of claim 1, wherein the data decoding system is further operable to:
   re-apply the data decode algorithm to the first modified output guided by the selected decoding result to yield a third decoded output; and
   re-apply the data decode algorithm to the second modified output guided by the selected decoding result to yield a fourth decoded output.

5. The data processing system of claim 1, wherein the decoder input includes a number of non-binary symbols.

6. The data processing system of claim 5, wherein the non-binary symbols each include four bits.

7. The data processing system of claim 5, wherein bits in the non-binary symbols are arranged in columns, and wherein each of the non-binary symbols in the first modified output include bits from consecutive columns.

8. The data processing system of claim 7, wherein at least one of the non-binary symbols in the second modified output include bits from non-consecutive columns.

9. The data processing system of claim 1, wherein the first modification algorithm is a pass through algorithm such that the first modified output is the same as the decoder input.

10. The data processing system of claim 9, wherein the second modification algorithm is a rotation algorithm such that the second modified output is a rotated version of the decoder input.

11. The data processing system of claim 1, wherein the system further comprises:
   a data detector circuit operable to apply a data detection algorithm to a sample set to yield a detected output, wherein the decoder input is derived from the detected output.

12. The data processing system of claim 11, wherein the data detector circuit is selected from a group consisting of: a Viterbi algorithm data detector circuit, and a maximum a posteriori data detector circuit.

13. The data processing system of claim 1, wherein the data decode algorithm is a low density parity check algorithm.

14. The data processing system of claim 1, wherein the data processing system is implemented as part of a device selected from a group consisting of: a storage device and a receiving device.

15. The data processing system of claim 1, wherein the data processing system is implemented as part of an integrated circuit.

16. A method, the method comprising:
   modifying a decoder input using a modification algorithm to yield a modified output;

applying a data decode algorithm by a data decoder circuit to the decoder input to yield a first decoded output;

applying the data decode algorithm by the data decoder circuit to the modified output to yield a second decoded output; and selecting one of the first decoded output as a selected decoding result based at least in part on a first number of unsatisfied checks in the first decoded output and a second number of unsatisfied checks in the second decoded output.

17. The method of claim 16, wherein the method further comprises:

re-applying the data decode algorithm to the first modified output guided by the selected decoding result to yield a third decoded output; and re-applying the data decode algorithm to the second modified output guided by the selected decoding result to yield a fourth decoded output.

18. The method of claim 16, the method further comprising:

determining the first number of unsatisfied checks corresponding to the first decoded output; and determining the second number of unsatisfied checks corresponding to the second decoded output.

19. The method of claim 16, wherein the decoder input includes a number of non-binary symbols, wherein bits in the non-binary symbols are arranged in columns, and wherein each of the non-binary symbols in the modified output include bits from non-consecutive columns.

20. A storage device, the storage device comprising:

a storage medium;

a head assembly disposed in relation to the storage medium and operable to provide a sensed signal corresponding to information on the storage medium;

a read channel circuit including:

an analog front end circuit operable to provide an analog signal corresponding to the sensed signal;

an analog to digital converter circuit operable to sample the analog signal to yield a series of digital samples;

an equalizer circuit operable to equalize the digital samples to yield a sample set;

a sample buffer operable to maintain the sample set;

a data decoder circuit operable to:

modify a decoder input using a first modification algorithm to yield a first modified output, wherein the decoder input is derived from the sample set;

modify the decoder input using a second modification algorithm to yield a second modified output;

apply a data decode algorithm by a data decoder circuit to the first modified output to yield a first decoded output;

apply the data decode algorithm by the data decoder circuit to the second modified output to yield a second decoded output;

select one of the first decoded output as a selected decoding result based at least in part on a first characteristic of the second decoded output and a second characteristic of the second decoded output;

re-apply the data decode algorithm to the first modified output guided by the selected decoding result to yield a third decoded output; and re-apply the data decode algorithm to the second modified output guided by the selected decoding result to yield a fourth decoded output.

* * * * *